(12) United States Patent
Goker et al.

(10) Patent No.: US 10,114,692 B2
(45) Date of Patent: Oct. 30, 2018

(54) HIGH/LOW ENERGY ZONE DATA STORAGE

(71) Applicant: Quantum Corporation, San Jose, CA (US)

(72) Inventors: Turguy Goker, Vista, CA (US); Suayb Arslan, Irvine, CA (US)

(73) Assignee: Quantum Corporation, San Jose, CA (US)

( * ) Notice: Subject to any disclaimer, the term of this patent is extended or adjusted under 35 U.S.C. 154(b) by 12 days.

(21) Appl. No.: 15/002,656

(22) Filed: Jan. 21, 2016

(65) Prior Publication Data

US 2016/0218751 A1 Jul. 28, 2016

Related U.S. Application Data

(60) Provisional application No. 62/108,190, filed on Jan. 27, 2015.

(51) Int. Cl.
*H03M 13/37* (2006.01)
*H03M 13/00* (2006.01)
(Continued)

(52) U.S. Cl.
CPC .......... *G06F 11/1008* (2013.01); *G06F 1/266* (2013.01); *G06F 1/3268* (2013.01); *G06F 3/0619* (2013.01); *G06F 3/0625* (2013.01); *G06F 3/0653* (2013.01); *G06F 3/0679* (2013.01); *G06F 11/1048* (2013.01); *G11B 20/1217* (2013.01); *G11B 20/1833* (2013.01); *H03M 13/353* (2013.01); *H03M 13/373* (2013.01); *H03M 13/611* (2013.01); *H05K 999/99* (2013.01); *H03M 13/13* (2013.01); *H03M 13/6381* (2013.01); *H03M 13/6393* (2013.01); *H03M 13/6513* (2013.01)

(58) Field of Classification Search
CPC .. G06F 1/3268; G06F 11/1008; G06F 3/0619; G06F 3/0625; G06F 3/0653; G06F 3/0679; H03M 13/353; H03M 13/373; H03M 13/611; H03M 13/13; H03M 13/6381; H03M 13/6393; H03M 13/6513; G11B 20/1833; G11B 20/1217
See application file for complete search history.

(56) References Cited

U.S. PATENT DOCUMENTS 9,727,266 B2 * 8/2017 Resch .................... G06F 3/0625
9,772,791 B2 * 9/2017 Resch .................... G06F 3/0643
(Continued)

*Primary Examiner* — Kyle Vallecillo
(74) *Attorney, Agent, or Firm* — Eschweiler & Potashnik, LLC

(57) ABSTRACT

Methods and apparatus associated with storing data in high or low energy zones are described. Example apparatus include a data storage system (DSS) that protects a message using an erasure code (EC). A location in the DSS may have an energy efficiency rating or a latency. Example apparatus include logics that produce an EC that has a likelihood of use, that select a location to store the EC in the DSS based on the energy efficiency rating, the latency, or the likelihood of use, that store the EC in the location, and that compute an order of retrieval for an EC stored in the location. The order of retrieval may be based on the energy efficiency rating or the latency. The EC may also have a priority based on the number of erasures for which the EC corrects.

22 Claims, 7 Drawing Sheets

(51) Int. Cl.
    *G11B 20/18*   (2006.01)
    *G06F 11/10*   (2006.01)
    *G06F 3/06*    (2006.01)
    *H03M 13/35*   (2006.01)
    *G06F 1/26*    (2006.01)
    *G06F 1/32*    (2006.01)
    *G11B 20/12*   (2006.01)
    *H03M 13/13*   (2006.01)

(56) References Cited

U.S. PATENT DOCUMENTS

| | | | | |
|---|---|---|---|---|
| 2011/0055474 A1* | 3/2011 | Resch | ............... | G06F 3/0619 711/114 |
| 2015/0331465 A1* | 11/2015 | Slik | ............... | G06F 1/28 713/300 |
| 2015/0331610 A1* | 11/2015 | Slik | ............... | G06F 3/0608 711/166 |
| 2015/0331621 A1* | 11/2015 | Slik | ............... | G06F 3/0652 711/114 |
| 2015/0331632 A1* | 11/2015 | Slik | ............... | G06F 9/54 711/154 |
| 2015/0331744 A1* | 11/2015 | Slik | ............... | H04L 67/1095 714/764 |
| 2015/0331774 A1* | 11/2015 | Slik | ............... | G06F 3/06 714/6.23 |
| 2015/0331775 A1* | 11/2015 | Slik | ............... | G06F 11/008 714/6.23 |
| 2015/0362983 A1* | 12/2015 | Frick | ............... | G06F 1/3203 713/324 |
| 2016/0011935 A1* | 1/2016 | Luby | ............... | G06F 3/0617 714/6.2 |
| 2016/0011936 A1* | 1/2016 | Luby | ............... | G06F 3/0617 714/6.2 |
| 2016/0011939 A1* | 1/2016 | Luby | ............... | G06F 11/1076 714/764 |
| 2016/0063008 A1* | 3/2016 | Benight | ............... | G06F 17/3012 707/694 |
| 2016/0380650 A1* | 12/2016 | Calder | ............... | G06F 11/1076 714/766 |

* cited by examiner

HIGH/LOW ENERGY ZONE DATA STORAGE

CROSS REFERENCE TO RELATED APPLICATIONS

This application claims the benefit of U.S. Provisional Application 62/108,190, filed Jan. 27, 2015.

BACKGROUND

The amount of electronic data stored and accessed by storage devices increases daily. The number and type of storage devices used to store and access data also continues to expand. Even as miniaturization and advancing technology increase the sophistication, reliability, and capacity of storage devices including hard disk drives, (HDD), shingled magnetic recording (SMR) devices, and tape drives, improved efficiencies are constantly sought for these devices. Improved efficiencies are needed because users who store data have limited resources. Limited resources may include electricity, cooling capacity, or physical storage space associated with storage devices. In particular, electricity is limited and may be costly. Additionally, as more and more storage devices store and access more and more data, the power and resources required to operate those devices, and to maintain the facilities in which those devices are stored, continues to increase.

Data that is stored or transmitted may be protected against storage media failures or other loss by storing extra copies, by storing additional redundant information, or in other ways. One type of redundancy based protection involves using erasure coding. Erasure coding uses additional redundant data to produce erasure codes that protect against 'erasures'. An erasure code (EC) allows data portions that are lost to be reconstructed from the surviving data. The application of erasure codes to data storage may typically have been for the purpose of recovering data in the face of failures of hardware elements storing the data. Some erasure codes may be simple to compute (e.g. systematic data) while other erasure codes may be more complex to compute (e.g. non-systematic data). The computational complexity may be a function of the approach used to compute parity data. For example, RS codes that compute parity data based on Galois Field arithmetic may have a higher computational cost than other approaches, including logical binary operations. Similarly, it may be simpler to recover data using some types of erasure codes in which data may already be available at the time of an access request (e.g. systematic data) and it may be more complex to recover data using other types of erasure codes (e.g. non-systematic data which requires decoding). However, conventional systems may compute erasure codes without considering the complexity of encoding the data. Conventional systems may also store erasure codes without considering the complexity of recovering the data. Thus, in conventional systems, the efficiency of encoding or recovering data based on the type of erasure code is not optimal. For example, conventional systems that store data and ECs on disk use sequential disk writes that do not consider the type of EC being written or the different energy requirements for reading or writing data at different zones on a disk.

Adding redundancy introduces overhead that consumes more storage capacity or transmission bandwidth, which in turn adds cost and may increase energy consumption. The overhead added by erasure code processing tends to increase as the protection level increases. Ideally, the redundant information may never need to be accessed, and thus conventional systems may group all redundancy data together and store it in some out of the way place. This one-size-fits-all approach may produce sub-optimal results, particularly concerning energy conservation.

BRIEF DESCRIPTION OF THE DRAWINGS

The accompanying drawings, which are incorporated in and constitute a part of the specification, illustrate various example apparatus, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
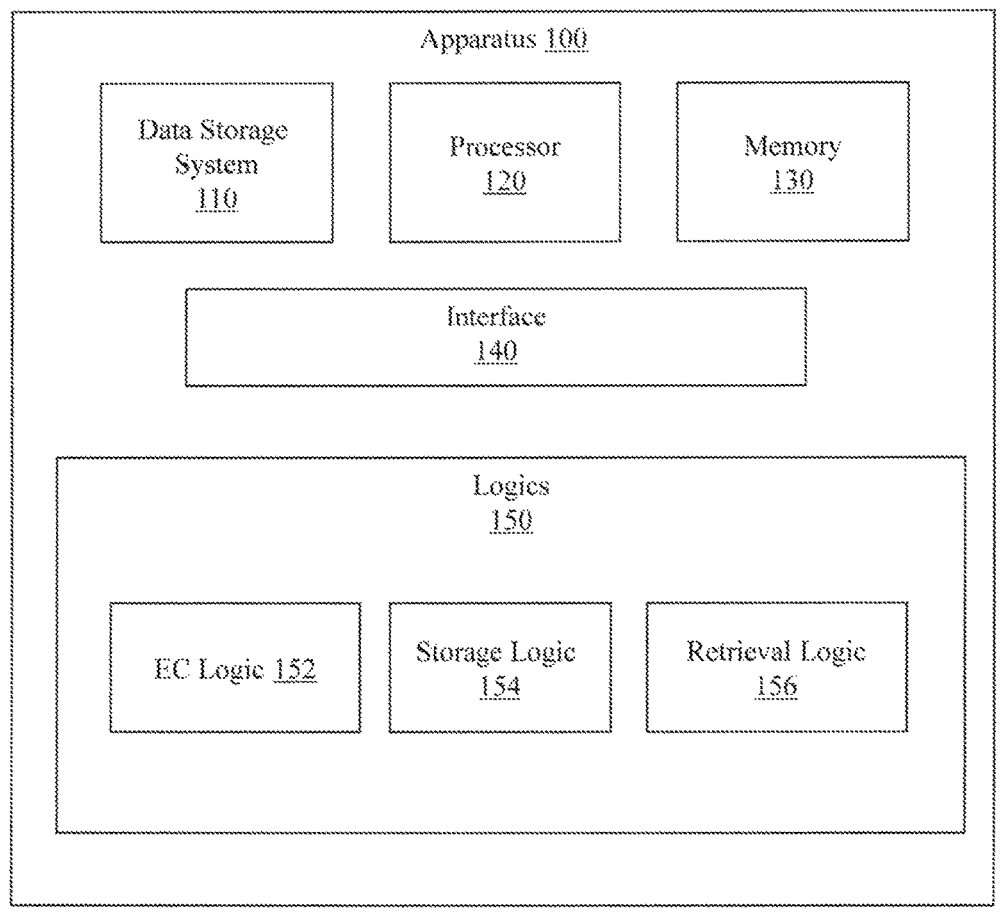
FIG. 1 illustrates an example data storage apparatus.

Example methods and apparatus improve the energy efficiency of data storage systems by storing data in high or low energy efficiency zones in a storage medium according to a property of the data or a property of the storage medium. This problem did not exist before the advent of electronic data storage systems. Increasing the energy efficiency of an array of rack mounted hard disk drives cannot be performed in the human mind because the human mind cannot control the transmission or expenditure of electricity in an electronic device. Similarly, reducing the amount of electricity used by an electronic storage device cannot be performed using paper and pencil because neither paper nor pencil can control the transmission or usage of electricity in an electronic device. For example, neither the human mind nor pencil and paper can control the power used by an HDD as it moves a read head from one disk sector to another to find parity data.

To enhance data protection, different approaches for storing redundant copies of data have been employed. Erasure codes are one such approach. An erasure code is a forward error correction (FEC) code for the binary erasure channel. The FEC facilitates transforming a message of k symbols into a longer message of n symbols so that the original message can be recovered from a subset of the n symbols, k and n being integers, where n>k. The symbols may be individual items, including characters or bytes, or groups of items. The original message may be, for example, a file. An erasure code optimized for overhead or storage efficiency has the property that any k out of the n code word symbols are sufficient to recover the original message. Erasure codes may be more or less efficient or optimal with respect to other conditions, including transfer bandwidth or repair complexity.

Fountain codes are one type of EC. Fountain codes have the property that a potentially limitless sequence of encoding symbols may be generated from a given set of source symbols in a manner that supports ideally recovering the original source symbols from any subset of the encoding symbols having a size equal to or larger than the number of source symbols. A fountain code may be space-optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k. In one embodiment, symbols are equally sized blocks or segments of information that are the smallest atomic units used by encoding or decoding operations.

An EC system may be described using an A/B notation, where B describes the total number of encoded symbols that can be produced for an input message and A describes the minimum number of the B encoded symbols that are required to reconstruct the message for which the encoded symbols where produced. By way of illustration, in a 10 of 16 configuration, or EC 10/16, sixteen encoded symbols could be produced. The 16 encoded symbols could be spread across a number of drives, nodes, or geographic locations. The 16 encoded symbols could even be spread across 16 different nodes, racks, or drives in 16 different geographic locations. In the EC 10/16 example, the original message could be reconstructed from 10 verified fragments. Conventionally, the 16 encoded symbols have been treated equally, which may have produced sub-optimal results, particularly with respect to conserving energy.

Example apparatus and methods may control where erasure codes are stored based, at least in part, on the likelihood that the data will be needed. Data that is most likely to be needed may be stored in a more energy efficient way or more energy efficient location because it might actually be used and thus the energy needed to use it might actually be consumed. Data that is less likely to be needed may be stored in a least energy efficient manner because it might never be used and thus the energy to use it might never be expended. For example, n coded symbols may have discernible access patterns. Depending on the encoding structure of an erasure code, the access patterns to the n coded symbols may demonstrate different trends in response to user requests. Some of the n coded symbols may be accessed more frequently than others depending on the mode of operation. For example, data read/write operations may result in different access patterns than repair or background operations. Putting data that is going to be used in an energy efficient location (e.g. low energy outer zone of a disk) while putting data that is not going to be used in a less energy efficient location (e.g. high energy inner zone of a disk) improves the overall energy efficiency of a data storage system. Considering that data storage systems may include thousands of disks, the improvements in energy efficiency may be substantial.

Example methods and apparatus may control where erasure codes are stored based on a priority associated with the erasure codes. In one embodiment, a priority ranking for data associated with a systematic EC is higher than a priority ranking for data associated with a non-systematic EC. In one embodiment, a priority ranking for data associated with a non-systematic EC varies inversely with the number of erasures for which the non-systematic EC corrects. Thus, a non-systematic EC that corrects for a single erasure may have a higher priority than a non-systematic EC that corrects for two erasures. In one embodiment, a priority ranking quantifies the access frequency of the original or parity data block. In another embodiment, a priority ranking may be based, at least in part, on an internal structure of an erasure code or an internal structure of a data allocation approach.

A priority ranking may change over time. In one embodiment, the priorities may change in response to a user configuration. In another embodiment, the priorities may self-adapt over time. The priorities may self-adapt based, at least in part, on performance data associated with a data storage system (DSS). The performance data may describe a number of errors experienced by the DSS, a type of error experienced by the DSS, a frequency of errors experienced by the DSS, a cost of power used by the DSS, a cost of network bandwidth used by the DSS, or other information.

Unlike conventional systems that store all ECs without regard to priorities, a storage location and a data storage device (DSD) within the DSS may be selected based, at least in part, on a priority. In one embodiment, a priority is a function of one or more factors. The factors may include, for example, a cost to store an EC on a DSD, a time to store an EC on a DSD, a number of I/O operations required for an action, an amount of energy required to store an EC on a DSD, or a network bandwidth required to store or repair an EC on a DSD. Considering the time required to store an EC may improve the computing efficiency of the DSD. Considering the amount of energy required to store an EC may improve the energy efficiency of the DSD. Considering the bandwidth required to store or repair an EC may reduce the network or data communication resources for the DSD.

Consider a situation where the DSD is a disk that includes a platter that rotates. A spinning platter may have high energy use zones (e.g. rings, sectors, or tracks, closer to the center of the platter) and lower energy use zones (e.g. rings, sectors, or tracks, closer to the out edge of the platter). Thus, example methods and apparatus may control the disk to position data on the platter based on a likelihood that the data will be used and the energy efficiency of the zone. For example, placement may be controlled so that the distance to the data relative to the outer edge of the platter varies inversely with the likelihood that the data will be used. Data that is more likely to be used will be placed in a higher energy efficiency zone closer to the outer edge of the platter, while data that is less likely to be used will be placed in a lower energy efficiency zone closer to the center of the platter.

Therefore, example apparatus and methods improve on conventional data storage approaches by reducing the power consumed by a data storage system while offering improved speed, erasure coding, and repair capabilities.

The detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on, refer to actions and processes of a computer system, logic, processor, or similar electronic device that manipulates and transforms data represented as physical (electronic) quantities.

FIG. 1 illustrates a data storage apparatus 100. Apparatus 100 includes a data storage system (DSS) 110, a processor 120, a memory 130, a set of logics 150, and an interface 140 that connects the DSS 110, the processor 120, the memory 130, and the set of logics 150. Memory 130 stores electronic data that manages ECs for messages in the DSS 110. In one embodiment, apparatus 100 may be a stand-alone device connected to a data communication network. In another embodiment, apparatus 100 may be integrated into another device, including a data deduplication system. Apparatus 100 may also be integrated into another system, including an object storage system.

DSS 110 protects a message stored in DSS 110 using an EC. DSS 110 includes at least one location. A location may be a track, a sector, a zone, or another division of the DSS 110. A location in the DSS 110 has an energy efficiency rating. In one embodiment, a location that has a higher level of energy efficiency (e.g. uses less power) has a higher energy efficiency rating than a location that has a lower level of energy efficiency (e.g. uses more power). For example, DSS 110 may include an HDD that has a platter that rotates. The platter may have a location near the center of the disk that has a low energy efficiency rating, and a location nearer the outer edge of the platter that has a higher energy efficiency rating. Thus, the energy efficiency rating may vary inversely with a distance of the location in the DSS 110 relative to the outer edge of the platter. The DSS 110 may be an HDD or an SMR device. In another embodiment, the DSS 110 may be another, different type of data storage device.

A location in DSS 110 may also have a latency rating. The latency rating represents the operational speed of DSS 110 at the location. In one embodiment, the latency rating is based on a seek time of DSS 110 at the location, a rotation delay of DSS 110 at the location, an access time of DSS 110 at the location, or a transfer rate of DSS 110 at the location. The latency rating, or the performance related factors upon which the latency rating is based, may change over time. In one embodiment, the latency rating may be based on other performance related factors associated with DSS 110 at the location.

DSS 110 stores, among other things, a set of ECs associated with a message. The ECs may be, for example, systematic erasure codes, non-systematic erasure codes, Reed-Solomon codes, rateless erasure codes including fountain codes, or other erasure codes. In one embodiment, the set of erasure codes stored in DSS 110 is sufficient to reconstruct the message. While DSS 110 is illustrated inside apparatus 100, in different embodiments, DSS 110 may be a standalone apparatus or a co-operating collection of apparatus.

The set of logics 150 includes an EC logic 152, a storage logic 154, and a retrieval logic 156. EC logic 152 produces an EC for a message present in the DSS 110. The EC has a likelihood of use. The likelihood of use represents the probability that the EC will be used, accessed, or otherwise manipulated. The likelihood of use may be related to a period of time. For example, a first EC may have a likelihood of use of one over a twelve hour period, meaning that it is certain that the first EC will be used during those twelve hours, while a second EC may have a likelihood of use of zero, meaning that the second EC will not be used during the twelve hours. In other embodiments, the likelihood of use may be represented in other ways, including as a percentage, or as a probability. Other periods of time may also be used.

In one embodiment, EC logic 152 produces the EC by encoding the message using a systematic erasure code, or a non-systematic erasure code, including but not limited to a Reed-Solomon (RS) code, a Raptor code, or a generic rateless code. A Raptor code is an example of the fountain code family. In one embodiment, other fountain codes may be used. Fountain codes may to refer to linear rateless codes that have efficient encoding and decoding operations. Other codes, such as truncated rateless codes including triangular and mojette codes may be used as linear rateless codes. A generic rateless code may include any rate compatible erasure code which can cover rate compatible versions of convolutional, Turbo, or low density parity check (LDPC) codes. Other non-linear rateless codes including spinal codes may also be employed. In another embodiment, other types of erasure codes may be used.

In one embodiment, EC logic 152 computes a priority for the EC. The priority is based on a function of the number of erasures for which the EC corrects. The priority varies inversely with the number of erasures for which the EC corrects. For example, an EC that corrects for a greater number of erasures will have a lower priority than an EC that corrects for a lesser number of erasures. In one embodiment, the priority changes in response to a user configuration.

In another embodiment, the priority may also self-adapt. The priority may self-adapt based, at least in part, on a performance data associated with DSS 110. The performance data describes performance factors associated with DSS 110. The performance data may include a number of errors experienced by DSS 110, a type of error experienced by DSS 110, a frequency of errors experienced by DSS 110, a cost of power used by DSS 110, or a cost of network bandwidth used by DSS 110. In another embodiment, other performance data may be used.

In another embodiment, the priority is additionally based on a cost to store an EC on DSS 110, a time to store an EC on DSS 110, an amount of energy used to store an EC on DSS 110, or a bandwidth required to store an EC on DSS 110. The priority may be additionally based on other properties associated with DSS 110.

Storage logic 154 stores the EC in a location in the DSS 110. Storage logic 154 selects the location based, at least in part, on the energy efficiency rating of the location in DSS 110 or the likelihood of use of the EC. For example, when likelihood information and energy efficiency information are available, ECs may be stored to optimize a utility measure that combines likelihood of use and energy efficiency. In one embodiment, the utility measure may be based on other properties of the EC or DSS 110. In one embodiment, storage logic 154 selects the location based, at least in part, on the energy efficiency rating of the location in the DSS 110, the likelihood of use of the EC, the priority, or the latency rating. For example, in one situation, storage logic 154 may select the location based on the energy efficiency rating and the priority, while in another situation, storage logic 154 may select the location based on the latency rating, the energy efficiency rating, and the likelihood of use. In another embodiment, storage logic 154 may select the location based on other properties of the DSS 110, or other properties of the EC.

Retrieval logic 156 computes an order of retrieval, based, at least in part, on the energy efficiency rating of the location in the DSS 110 or the likelihood of use of the EC. Retrieval logic 156 retrieves the EC from the DSS 110 based, at least in part, on the order of retrieval. In one embodiment, retrieval logic 156 computes the order of retrieval based on the priority, the energy efficiency rating, or the likelihood of use. In another embodiment, retrieval logic 156 computes the order of retrieval based on other properties of the DSS 110, or other properties of the EC. The order of retrieval may be non-sequential or sequential.

Figure 7:
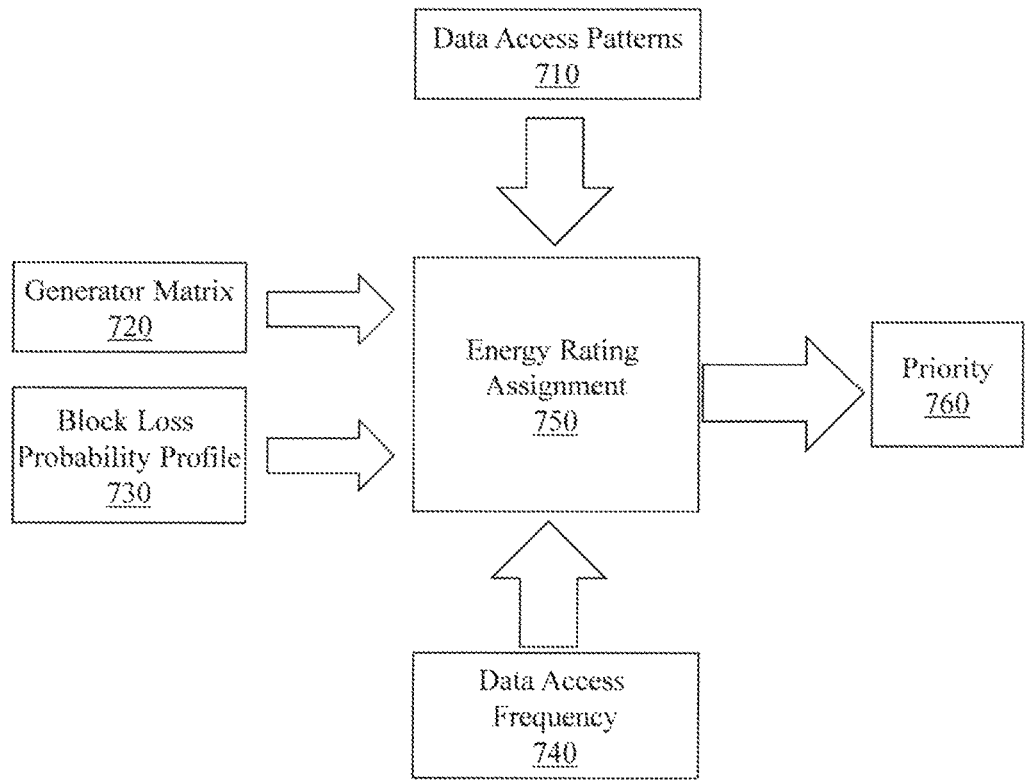
FIG. 7 illustrates an example workflow diagram of the computation of a priority.

FIG. 7 is a workflow diagram that illustrates one way in which example methods and apparatus may compute a priority. In one embodiment, data access patterns 710, generator matrix 720, block loss probability profile 730, and data access frequency 740 are used to compute an energy rating assignment 750. A priority 760 is then computed based, at least in part, on the energy rating assignment 750. In one embodiment, EC logic 152 computes the energy rating assignment 750 based on data access patterns 710, generator matrix 720, block loss probability profile 730, and data access frequency 740. EC logic 152 then computes the priority 760 using the energy rating assignment 750.

Figure 2:
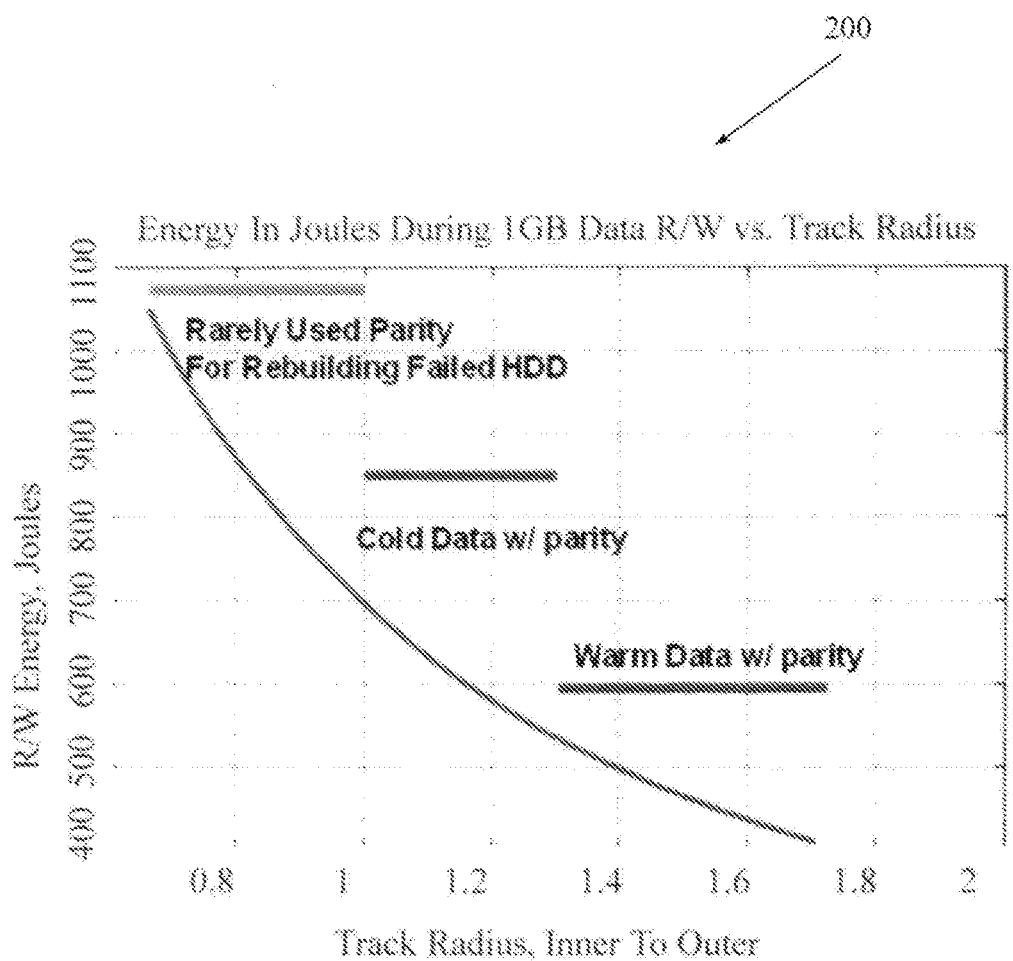
FIG. 2 is a graph illustrating read/write energy in joules versus platter radius for an example HDD platter.

FIG. 2 is a graph that illustrates a relationship between where data is stored on a disk and how much energy it takes to access the stored data. The x-axis indicates a track radius for a track on a disk platter. The y-axis indicates the energy in joules required to read or write data at a track radius. Spinning disk platters may have different zones that use different amounts of energy to read and write data. The energy usage is related to spinning the disk and read/write head movement, and varies with the track radius, or distance from the outer edge of the platter. Other data storage devices may also have different zones that use different amounts of energy to read and write data.

Figure 4:
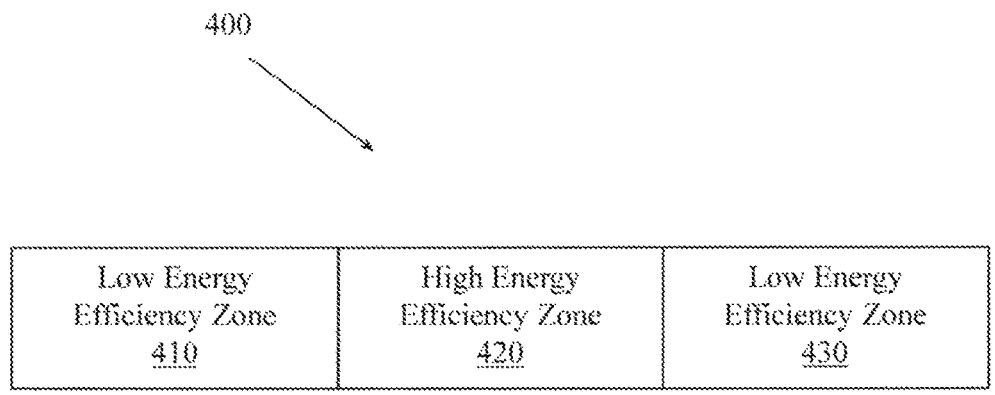
FIG. 4 illustrates a section of linear tape open (LTO) tape having different energy efficiency zones.

For example, FIG. 4 illustrates a section of LTO tape 400 that has three different energy zones. The section of LTO tape 400 includes a low energy efficiency zone 410. Low energy efficiency zone 410 may require the use of more energy to read or write data. The section of LTO tape 400 also includes high energy efficiency zone 420. High energy efficiency zone 420 may require less energy to read or write data than is required to read or write data from low energy efficiency zone 410. The section of LTO tape 400 also includes another low energy efficiency zone 430. Low energy efficiency zone 430 is similar to low energy efficiency zone 410, but is located at the other end of the section of LTO tape 400. In the example illustrated by FIG. 4, zone 410 has a low energy efficiency rating and zone 430 has a low energy efficiency rating, while zone 420 has a high energy efficiency rating. In other examples, a section of LTO tape may have other numbers of energy efficiency zones, or the energy efficiency zones may be arranged differently.

In one embodiment, the functionality associated with the set of logics 150 may be performed, at least in part, by hardware logic components. The hardware logic components may include, but are not limited to, field-programmable gate arrays (FPGAs), application specific integrated circuits (ASICs), application specific standard products (ASSPs), system on a chip systems (SOCs), graphic processing units (GPUs), or complex programmable logic devices (CPLDs). In one embodiment, individual members of the set of logics 150 are implemented as ASICs or SOCs. In another embodiment, the set of logics 150 may be other types of systems or circuits. Apparatus 100 may be operably connected to a smartphone, a laptop computer, a tablet computer, a desktop computer, a network communication device, or a set of data storage devices.

While FIG. 1 illustrates example apparatus 100 that includes various components connected in various ways, it is to be appreciated that other apparatus may include other components connected in other ways.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 3:
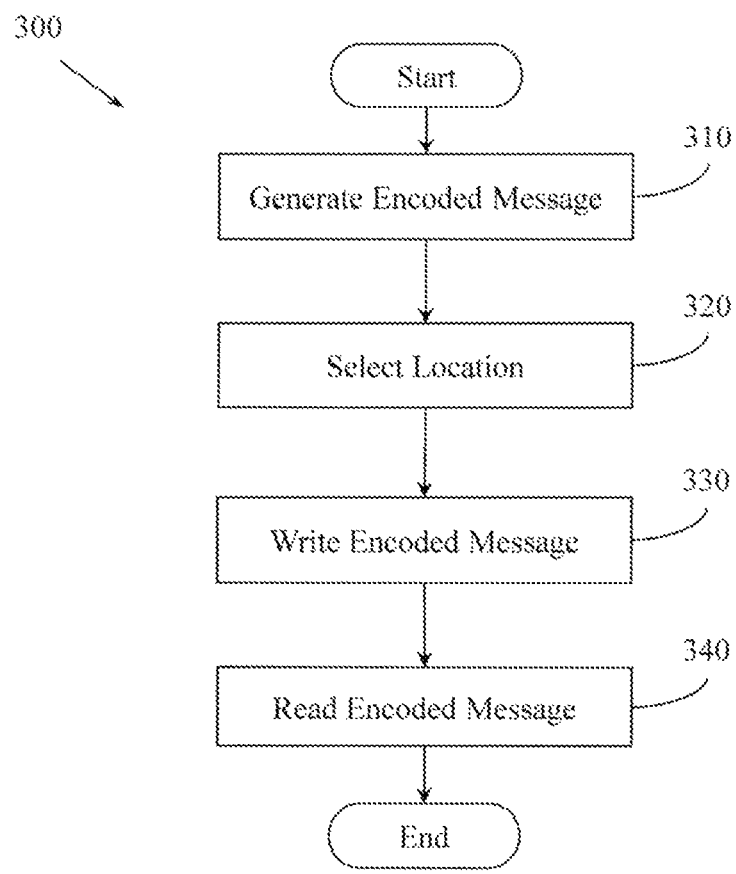
FIG. 3 illustrates an example method for storing data in an energy efficient manner.

FIG. 3 illustrates an example method 300 for storing data in an energy efficient manner. Method 300 includes, at 310, generating an encoded message. The encoded message is generated using an erasure code (EC). Method 300 may, at 310, generate the encoded message using a systematic EC, or a non-systematic EC, including a rateless code, a fountain code, a Raptor code, a Reed-Solomon code or another erasure code. The encoded message has a storage priority based on a function of the number of erasures for which the EC corrects. The storage priority varies inversely with the number of erasures for which the EC corrects. In another embodiment, the storage priority may be based on other properties of the encoded message.

In one embodiment, the encoded message has an access probability. The access probability is the probability that the encoded message will be accessed within a threshold period of time. The threshold period of time may be a minute, an hour, a day, or another period of time.

Method 300 also includes, at 320 selecting a location in a DSD to store the encoded message. Method 300 selects the location based, at least in part, on a direct relationship between an energy efficiency rating of the location and the storage priority. For example, for an encoded message with a high priority, method 300 may, at 320, select a location with a high energy efficiency rating, while for an encoded message with a low priority, method 300 may, at 320, select a location with a low energy efficiency rating.

Method 300 also includes, at 330, writing the encoded message in the location. The encoded message is written according to a write order based, at least in part, on the storage priority or the energy efficiency rating. For example, method 300 may, at 330, base a write order on the storage priority and energy efficiency rating. Method 300 may, at 330, choose to write a portion of the encoded message with a high priority before writing a portion of the encoded message with a low priority. The write order may also be based on a data protection policy associated with a user, with the DSD, or with the encoded message. The write order may be non-sequential.

Method 300 also includes, at 340, reading the encoded message from the location. The encoded message is read according to a read order based, at least in part, on the storage priority. In one example, the encoded message is read non-sequentially. In another embodiment, the message is read sequentially. The read order may also be based on a data protection policy associated with the encoded message, the DSD, or a user. In another embodiment, the read order may be based on the storage priority, the energy efficiency rating, or the latency rating.

In one embodiment of method 300, the location in the DSD may have a latency rating. The latency rating is based on a seek time of the DSD at the location, a rotation delay of the DSD at the location, an access time of the DSD at the location, or a transfer rate of the DSD at the location. A location with higher latency (e.g. long seek times, high rotation delays, long access times, or slow transfer rates) has a higher latency rating, while a location with faster access times, faster transfer rates, or lower rotation delays would have a lower latency rating. In this embodiment, method 300 comprises selecting a location in the DSD based, at least in part, on a direct relationship between the energy efficiency rating and the storage priority, or an inverse relationship between the latency rating and the storage priority. For example, method 300 may select the location based on an inverse relationship between the latency rating and storage priority. In this example, for an encoded message with a low storage priority, method 300 may select a location with a high latency rating. Thus, an encoded message that has a low priority may be stored in a location with a higher (e.g. worse) latency rating. An encoded message with a high priority may be stored in a location with a lower (e.g. better) latency.

Method 300 may select a location based on other combinations or relationships between the energy efficiency rating, the latency rating, the storage priority, or the access probability. In one embodiment, method 300 may include selecting a location in the DSD based, at least in part, on a direct relationship between the energy efficiency rating and the access probability or the storage priority. In another embodiment, method 300 may select a location in the DSD based, at least in part, an inverse relationship between the latency rating and the access probability or the storage priority.

Example methods and apparatus may employ different types of storage devices. In one embodiment of method 300, the DSD is a disk drive that includes a platter that rotates. The platter has an outer edge, where a first location is a first distance from the outer edge of the platter and has a first energy efficiency rating. The platter also has a second location that is a second distance from the outer edge of the platter and has a second, different energy efficiency rating. In this example, the first distance is less than the second distance and the first energy efficiency rating is greater than the second energy efficiency rating. The DSD may have more than two zones with different energy efficiency ratings.

In another embodiment, the DSD may be an LTO tape drive that includes an LTO tape. In this embodiment, the LTO tape includes a set of zones. A first zone includes a first location that has a first energy efficiency rating. A second, different zone includes a second location that has a second energy efficiency rating. The first energy efficiency rating is greater than the second energy efficiency rating. FIG. 4 illustrates an example section 400 of LTO tape that has different energy zones that may be employed by example methods and apparatus. In other embodiments, other numbers of energy zones may be used.

While FIG. 3 illustrates various actions occurring in serial, it is to be appreciated that various actions illustrated in FIG. 3 could occur substantially in parallel. By way of illustration, a first process could generate an encoded message, a second process could select a location in a data store, and a third process could write the encoded message to the location. While three processes are described, it is to be appreciated that a greater or lesser number of processes could be employed and that lightweight processes, regular processes, threads, and other approaches could be employed.

Figure 5:
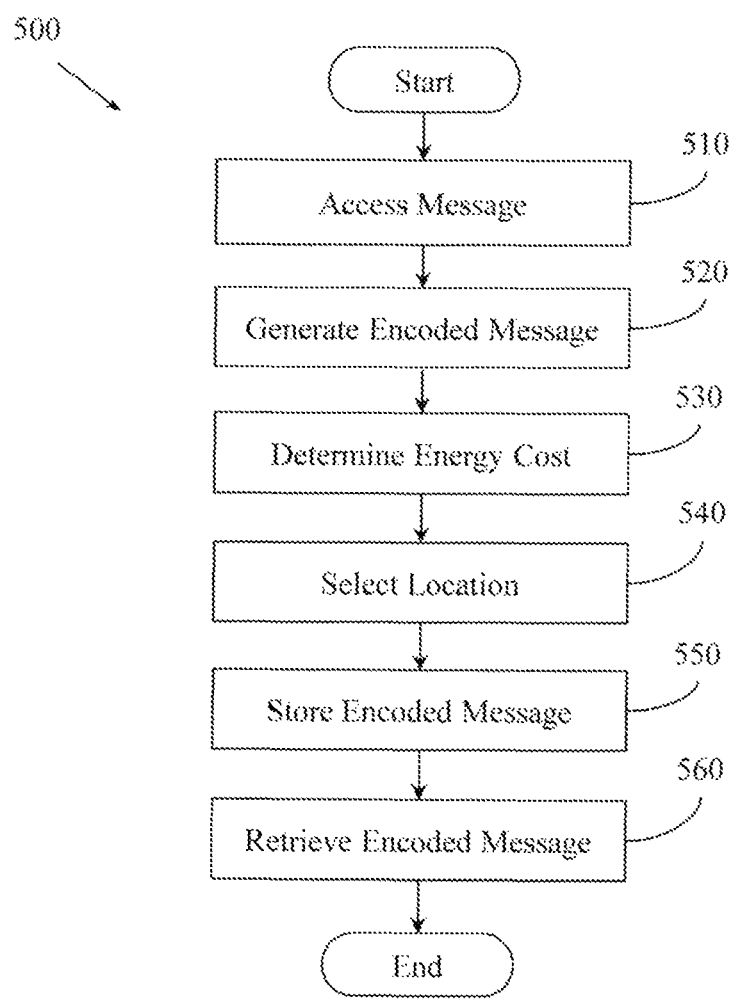
FIG. 5 illustrates an example method for storing data.

FIG. 5 illustrates an example method 500 that is similar to method 300 but includes additional steps. Method 500 includes, at 510, accessing a message. The message may be a file, a data object, or a portion of a file. The message may be accessed from a memory or from a data storage device. The message may be accessed across a network.

Method 500 also includes, at 520 generating an encoded message by encoding the message using an erasure code. The message may be encoded using a systematic EC, a non-systematic EC, a rateless code such as a Raptor code, or a Reed-Solomon code or a generic erasure code. The encoded message has a priority ranking. The priority ranking may be based on the number of erasures an EC in the encoded message corrects. The priority ranking may also be based on performance data associated with a data storage device on which the encoded message is stored.

Method 500 also includes, at 530, determining an energy cost of storing the encoded message in a location on a data storage device. The energy cost may be determined as a function of an energy efficiency rating of a location on the data storage device.

Method 500 also includes, at 540, selecting a location on the data storage device. Method 500 selects the location based, at least in part, on the priority ranking and the energy cost.

Method 500 also includes, at 550, storing the encoded message in the location. In one embodiment, method 500 stores the encoded message by writing the encoded message in a non-sequential manner in the location. Method 500 may store the encoded message according to a storage order based, at least in part, the priority ranking, the energy cost, a data protection policy associated with the data storage device, or a data protection policy associated with the encoded message.

Method 500 also includes, at 560, retrieving the encoded message from the location in an order based, at least in part, on the priority ranking or the energy cost. The message may be retrieved from the location in a non-sequential manner. The order may be user-adjustable, or may be based on a data protection policy associated with the data storage device or the encoded message.

Figure 6:
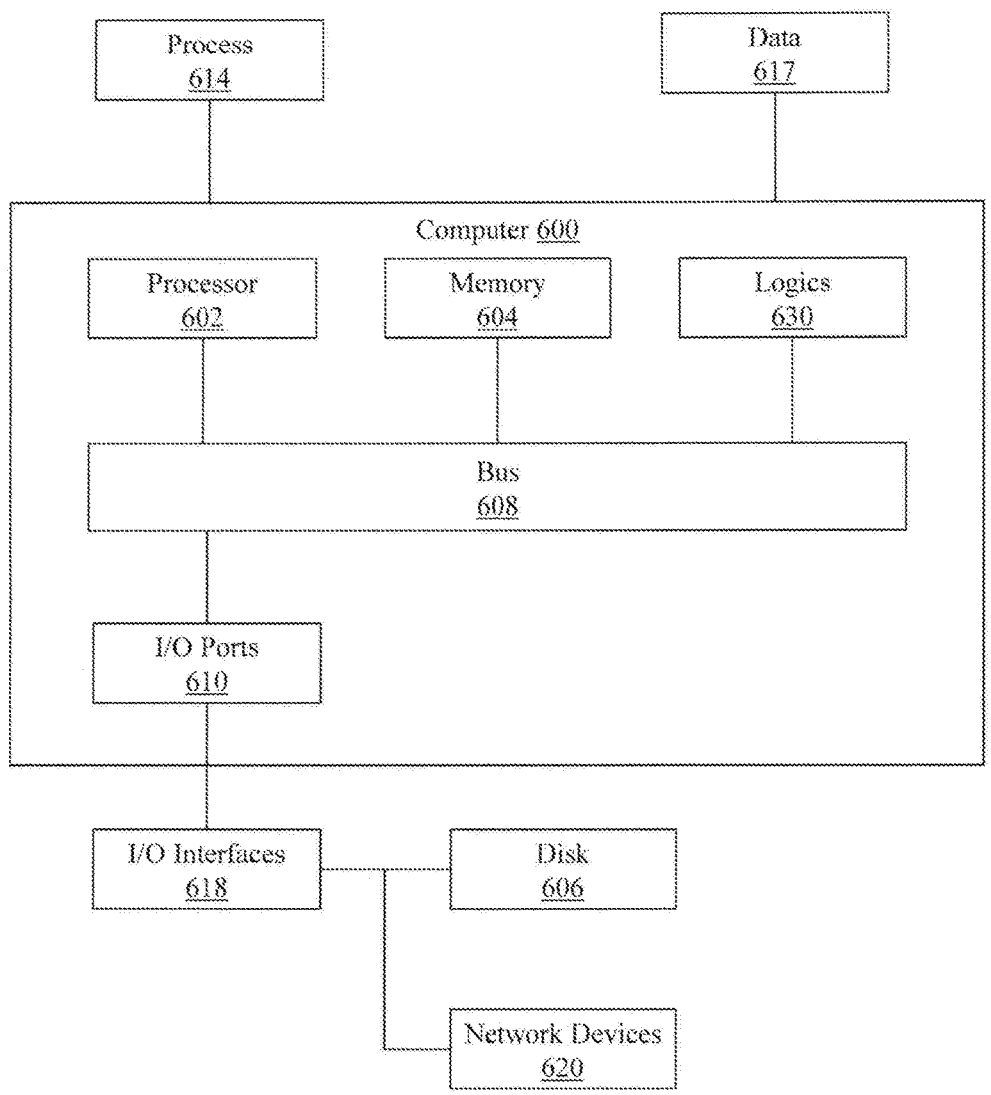
FIG. 6 illustrates an example computer in which methods and apparatus described herein may be implemented.

FIG. 6 illustrates an example computer 600 in which example methods illustrated herein can operate and in which example logics may be implemented. In different examples, computer 600 may be part of a router, a server, a laptop computer, a tablet computer, or may be operably connectable to a data storage device.

Computer 600 includes a processor 602, a memory 604, and input/output ports 610 operably connected by a bus 608. In one example, computer 600 may include a set of logics 630 that perform a method of storing data in an energy efficient manner. Thus, the set of logics 630, whether implemented in computer 600 as hardware, firmware, software, and/or a combination thereof may provide means (e.g., hardware, software) for controlling data storage devices, including HDDs, SMR devices, or LTO tape drives to store data in an energy efficient manner. In different examples, the set of logics 630 may be permanently and/or removably attached to computer 600. In one embodiment, the functionality associated with the set of logics 630 may be performed, at least in part, by hardware logic components including, but not limited to, FPGAs, ASICs, ASSPs, SOCs, or CPLDs. In one embodiment, individual members of the set of logics 630 are implemented as ASICs or SOCs.

Processor 602 can be a variety of various processors including dual microprocessor and other multi-processor architectures. Memory 604 can include volatile memory and/or non-volatile memory. A disk 606 may be operably connected to computer 600 via, for example, an input/output interface (e.g., card, device) 618 and an input/output port 610. Disk 606 may include, but is not limited to, devices like a magnetic disk drive, a tape drive, a Zip drive, a flash memory card, or a memory stick. Furthermore, disk 606 may include optical drives like a CD-ROM or a digital video ROM drive (DVD ROM). Memory 604 can store processes 614 or data 617, for example. Disk 606 or memory 604 can store an operating system that controls and allocates resources of computer 600.

Bus 608 can be a single internal bus interconnect architecture or other bus or mesh architectures. While a single bus is illustrated, it is to be appreciated that computer 600 may communicate with various devices, logics, and peripherals using other busses that are not illustrated (e.g., PCIE, SATA, Infiniband, 1394, USB, Ethernet).

Computer 600 may interact with input/output devices via I/O interfaces 618 and input/output ports 610. Input/output devices can include, but are not limited to, a keyboard, a microphone, a pointing and selection device, cameras, video cards, displays, disk 606, network devices 620, or other devices. Input/output ports 610 can include but are not limited to, serial ports, parallel ports, or USB ports.

Computer 600 may operate in a network environment and thus may be connected to network devices 620 via I/O interfaces 618 or I/O ports 610. Through the network devices 620, computer 600 may interact with a network. Through the network, computer 600 may be logically connected to remote computers. The networks with which computer 600 may interact include, but are not limited to, a local area network (LAN), a wide area network (WAN), or other networks.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores instructions or data. "Computer-readable storage medium" does not refer to propagated signals. A computer-readable storage medium may take forms, including, but not limited to, non-volatile media, and volatile media. Non-volatile media may include, for example, optical disks, magnetic disks, tapes, and other media. Volatile media may include, for example, semiconductor memories, dynamic memory, and other media. Common forms of a computer-readable storage medium may include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

"Logic", as used herein, includes but is not limited to hardware or firmware, or combinations of each to perform a function(s) or an action(s), or to cause a function or action from another logic, method, or system. Logic may include a software controlled microprocessor, a discrete logic (e.g., ASIC), an analog circuit, a digital circuit, a programmed logic device, a memory device containing instructions, and other physical devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

To the extent that the term "includes" or "including" is employed in the detailed description or the claims, it is intended to be inclusive in a manner similar to the term "comprising" as that term is interpreted when employed as a transitional word in a claim.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. An apparatus for storing data, comprising:
   a data storage system (DSS) that protects a message using an erasure code (EC), where a location in the DSS has an energy efficiency rating, and where the DSS is a hard disk drive (HDD) or a shingled magnetic recording (SMR) device that includes a platter that rotates, where the platter has an outer edge;
   a processor;
   a memory that stores electronic data that manages ECs for messages in the DSS;
   a set of logics; and
   an interface that connects the processor, the memory, the DSS, and the set of logics, the set of logics including:
      an EC logic that produces an EC for a message present in the DSS, where the EC has a likelihood of use;
      a storage logic that stores the EC in a location in the DSS, where the storage logic determines the energy efficiency rating of the location, and where the storage logic selects the location based, at least in part, on the energy efficiency rating of the location in the DSS or the likelihood of use of the EC; and
      a retrieval logic that computes an order of retrieval, based, at least in part, on the energy efficiency rating of the location in the DSS or the likelihood of use of the EC, and where the retrieval logic retrieves the EC from the DSS based, at least in part, on the order of retrieval.

2. The apparatus of claim 1, where the EC logic computes a priority for the EC, where the priority is based on a function of the number of erasures for which the EC corrects.

3. The apparatus of claim 2, where the priority varies inversely with the number of erasures for which the EC corrects.

4. The apparatus of claim 2, where the priority changes in response to a user configuration.

5. The apparatus of claim 2, where the priority self-adapts based, at least in part, on a performance data associated with the DSS.

6. The apparatus of claim 5, where the performance data describes a number of errors experienced by the DSS, a type of error experienced by the DSS, a frequency of errors experienced by the DSS, a cost of power used by the DSS, or a cost of network bandwidth used by the DSS.

7. The apparatus of claim 2, where the priority is, additionally, based on a cost to store an EC on the DSS, a time to store an EC on the DSS, an amount of energy used to store an EC on the DSS, or a bandwidth required to store an EC on the DSS.

8. The apparatus of claim 2, where the location has a latency rating, where the latency rating is based on a seek time of the DSS at the location, a rotation delay of the DSS at the location, an access time of the DSS at the location, or a transfer rate of the DSS at the location.

9. The apparatus of claim 8, where the storage logic selects the location based, at least in part, on the energy efficiency rating, the latency rating, the likelihood of use, or the priority.

10. The apparatus of claim 9, where the storage logic optimizes a utility measure based on the likelihood of use and the energy efficiency rating.

11. The apparatus of claim 2, where the retrieval logic computes the order of retrieval based, at least in part, on the priority, the energy efficiency rating, or the likelihood of use.

12. The apparatus of claim 1, where the energy efficiency rating varies inversely with a distance of the location in the DSS relative to the outer edge of the platter.

13. The apparatus of claim 1, where the EC logic produces the EC by encoding the message using a systematic erasure code, a non-systematic erasure code, a Fountain code, a Reed-Solomon (RS) code, or a rate-compatible rateless code.

14. A non-transitory computer-readable storage medium storing computer executable instructions that when executed by a computer control the computer to perform a method for storing data in an energy efficient manner, the method comprising:
generating an encoded message, where the encoded message is generated using an erasure code (EC), where the encoded message has a storage priority based on a function of the number of erasures for which the EC corrects, and where the storage priority varies inversely with the number of erasures for which the EC corrects;
selecting a location in a data storage device (DSD) based, at least in part, on a direct relationship between an energy efficiency rating of the location and the storage priority;
writing the encoded message in the location, where the encoded message is written according to a write order based, at least in part, on the storage priority or the energy efficiency rating; and
reading the encoded message from the location, where the message is read according to a read order based, at least in part, on the storage priority.

15. The non-transitory computer-readable storage medium of claim 14,
where the location has a latency rating, where the latency rating is based on a seek time of the DSD at the location, a rotation delay of the DSD at the location, an access time of the DSD at the location, or a transfer rate of the DSD at the location,
the method comprising selecting a location in the DSD based, at least in part on a direct relationship between the energy efficiency rating and the storage priority, or an inverse relationship between the latency rating and the storage priority.

16. The non-transitory computer-readable storage medium of claim 15, where the encoded message has an access probability, where the access probability is the probability that the encoded message will be accessed within a threshold period of time.

17. The non-transitory computer-readable storage medium of claim 16, the method comprising selecting a location in the DSD based, at least in part, on a direct relationship between the energy efficiency rating and the access probability.

18. The non-transitory computer-readable storage medium of claim 16, the method comprising selecting a location in the DSD based, at least in part, on an inverse relationship between the latency rating and the access probability or the storage priority.

19. The non-transitory computer-readable storage medium of claim 15, the method comprising reading the encoded message from the location, where the message is read according to a read order, based, at least in part, on the storage priority, the energy efficiency rating, or the latency rating.

20. The non-transitory computer-readable storage medium of claim 14, where the DSD is a disk drive that includes a platter that rotates, where the platter has an outer edge, where a first location is a first distance from the outer edge of the platter and has a first energy efficiency rating, and a second location is a second distance from the outer edge of the platter and has a second, different energy efficiency rating, where the first distance is less than the second distance, and where the first energy efficiency rating is greater than the second energy efficiency rating.

21. The non-transitory computer-readable storage medium of claim 14, where the DSD includes a linear tape open (LTO) tape, where the LTO tape includes a set of zones, where a first zone includes a first location, where the first location has a first energy efficiency rating, and a second, different zone includes a second location, where the second location has a second energy efficiency rating, where the first energy efficiency rating is greater than the second energy efficiency rating.

22. A method for storing data, comprising:
accessing a message;
generating an encoded message by encoding the message using an erasure code, where the encoded message has a priority ranking;
determining an energy cost of storing the encoded message in a location on a data storage device;
selecting a location on the data storage device based, at least in part, on the priority ranking and the energy cost;
storing the encoded message in the location; and
retrieving the encoded message from the location in an order based, at least in part, on the priority ranking or the energy cost.

* * * * *